(12) United States Patent
Yang et al.

(10) Patent No.: US 11,990,363 B2
(45) Date of Patent: May 21, 2024

(54) WAFER SUPPORT PIN LIFTING DEVICE

(71) Applicant: PIOTECH INC., Shenyang (CN)

(72) Inventors: Dezan Yang, Shenyang (CN); Hualong Yang, Shenyang (CN); Fengli Wu, Shenyang (CN)

(73) Assignee: PIOTECH INC., Shenyang (CN)

( * ) Notice: Subject to any disclaimer, the term of this patent is extended or adjusted under 35 U.S.C. 154(b) by 342 days.

(21) Appl. No.: 17/550,589

(22) Filed: Dec. 14, 2021

(65) Prior Publication Data

US 2022/0208595 A1 Jun. 30, 2022

(30) Foreign Application Priority Data

Dec. 31, 2020 (CN) .......................... 202011633338.2

(51) Int. Cl.
*H01L 21/687* (2006.01)
(52) U.S. Cl.
CPC ............................. *H01L 21/68742* (2013.01)
(58) Field of Classification Search
CPC ............. H01L 21/687; H01L 21/68742; H01L 21/68785; H01L 21/68792; H01J 2237/332–3348
USPC .................... 118/715–733; 156/345.1–345.55
See application file for complete search history.

(56) References Cited

U.S. PATENT DOCUMENTS

| | | | | |
|---|---|---|---|---|
| 4,825,714 A | * | 5/1989 | Yamanaka | H01L 21/68 74/89.23 |
| 9,460,954 B2 | * | 10/2016 | De Jong | H01L 21/6776 |
| 2003/0000775 A1 | * | 1/2003 | Yudovsky | H01L 21/67748 187/250 |
| 2011/0222038 A1 | * | 9/2011 | Yamashita | H01J 37/32192 355/72 |
| 2011/0236162 A1 | * | 9/2011 | Shikayama | H01L 21/68742 414/222.01 |
| 2015/0243542 A1 | * | 8/2015 | Yoshihara | H01L 21/68728 156/345.23 |
| 2017/0287753 A1 | * | 10/2017 | Musselman | H01L 21/68742 |
| 2018/0350644 A1 | * | 12/2018 | Matsuura | H01L 21/3065 |
| 2018/0350654 A1 | * | 12/2018 | Forderhase | H01L 21/68792 |

FOREIGN PATENT DOCUMENTS

CN 110970343 A * 4/2020 ............. C23C 16/44

* cited by examiner

*Primary Examiner* — Eric J Rosen
*Assistant Examiner* — Kent N Shum
(74) *Attorney, Agent, or Firm* — Locke Lord LLP; Tim Tingkang Xia, Esq.

(57) ABSTRACT

A wafer support pin lifting device includes a support plate, a slide block and a lifting pole. The support plate is for supporting multiple support pins. The slide block is slidably connected to an inner wall of a cavity so that the slide block slides relative to the cavity. The lifting pole has a first end, a second end and a third end. The first end is connected to the support plate, the second end is pivotally connected to the slide block, and the third end is connected to an actuator. With the pivotal connection between the second end of the lifting pole and the slide block, the lifting pole approaching the high position causes the support plate to be approximately horizontal, and the lifting pole approaching the low position causes the support plate to be tilted.

14 Claims, 5 Drawing Sheets

WAFER SUPPORT PIN LIFTING DEVICE

CROSS-REFERENCE TO RELATED APPLICATIONS

This non-provisional application claims priority under 35 U.S.C. § 119(a) to Patent Application No(s). 202011633338.2 filed in China on Dec. 31, 2020, the entire contents of which are hereby incorporated by reference.

BACKGROUND OF THE INVENTION

Field of the Invention

The present invention relates to a lifting device, and more particularly to a lifting device for controlling wafer support pins in a processing cavity.

Description of the Prior Art

A semiconductor film on a wafer or a substrate is formed in a cavity of a coating device (or a processing device). Mechanical fingers place a wafer to be processed on a plurality of support pins of a carrier plate in the cavity, or take a processed wafer out of a cavity from support pins on a carrier plate. The support pins are components that can ascend or descend relative to the carrier plate, so as to transfer the wafer from the mechanical fingers onto the carrier plate.

It is conventionally known that a lifting device for controlling lifting of the support pins is configured below the carrier plate at a bottom portion of the cavity. In general, it is known that a lifting device can raise or lower support pins with vertical degrees of freedom, and in order to ensure that the wafer does not slip on the support pins while the wafer is transferred by the mechanical pins, horizontal levels of these support pins need to be kept at an equal height, or it is necessary that any tilting of common mechanisms connecting these support pins be avoided. In a situation where the support pins are kept at an equal height, if the cavity still contains gas when the support pins lower the wafer onto the carrier plate, the wafer may encounter airflow disturbances as approaching a surface of the carrier plate and possibly shifted. When the support pins raise the wafer, if any slight vacuum suction force exists between a bottom surface of the wafer and the surface of the carrier plate, the wafer may slip on the support pins at the instant moment when lifted. There are known techniques that use a plurality of independent lifting devices to respectively control lifting of the support pins, allowing tilting of the wafer and a contact with the carrier plate. However, such control strategy involves complications. Moreover, if any of the lifting device malfunctions, shifting of the position of the wafer may be caused.

Therefore, there is a need for a simple support pin lifting device that allows a wafer to contact a carrier plate at a tolerable tilting angle.

SUMMARY OF THE INVENTION

It is an object of the present invention to provide a wafer support pin lifting device suitable for a cavity. The wafer support pin lifting device includes: a support plate, for supporting a plurality of support pin; a slide block, slidably connected to an inner wall of the cavity so that the slide block slides relative to the cavity; and a lifting pole, having a first end, a second end and a third end. The first end is connected to the support plate, the second end is pivotally connected to the slide block, and the third end is connected to an actuator, wherein the actuator is for controlling the lifting pole to ascend and descend between a high position and a low position. With the pivotal connection between the second end of the lifting pole and the slide block, the lifting pole approaching the high position causes the support plate to be approximately horizontal, and the lifting pole approaching the low position causes the support plate to be tilted.

In a specific embodiment, the support plate has a top portion and a bottom portion. The top portion is for carrying the plurality of support pins, and the bottom portion is connected to the first end of the lifting pole.

In a specific embodiment, the top portion of the support plate has a first support portion, a second support portion and a third support portion for carrying the plurality of support pins. The bottom portion of the support plate has a sleeve, the position of the sleeve is opposite to the position of the first support portion, and the sleeve is connected to the first end of the lifting pole.

In a specific embodiment, the inner wall of the cavity is provided with a slide track, and the slide block is connected to the inner wall via the slide track so that the slide block ascends and descends relative to the inner wall.

In a specific embodiment, the first end of the lifting pole is opposite to the third end, the second end of the lifting pole is located between the first end and the third end, the second end has a connection arm laterally extending from the lifting pole, and the connection arm is pivotally connected to the slide block so that the lifting pole is pivotal relative to the slide block.

In a specific embodiment, the slide block has an inner side and an outer side. The outer side has a slide channel for connecting to the slide track, a first limiting surface and a second limiting surface are formed at the inner side, and the first limiting surface and the second limiting surface are opposite so as to form an accommodating space.

In a specific embodiment, the connection arm has a top portion and a bottom portion. The top portion of the connection arm has a protrusion, and the protrusion extends upwards from a top portion of the connection arm and is partially accommodated in the accommodating space formed by the first limiting surface and the second limiting surface.

In a specific embodiment, the second limiting surface is provided with a first spring, and the first spring applies a lateral biasing force towards the first limiting surface on the protrusion.

In a specific embodiment, the inner wall is provided with a second spring, and the second sprig is located below the connection arm and configured to apply an upward biasing force on the bottom portion of the connection arm when the lifting pole approaches the low position, so that the lifting pole pivots relative to the slide block, causing the support plate tilted.

In a specific embodiment, the connection arm at the high position receives only the lateral biasing force applied on the protrusion from the first spring, so that the protrusion contacts the first limiting surface to force the support plate to become horizontal, and the horizontal support plate causes the plurality of support pins to be at same horizontal level.

In a specific embodiment, the connection arm at the low position receives the lateral biasing force applied on the protrusion from the first spring and the upward biasing force applied on the bottom portion of the connection arm from the second spring, so that the support plate is forced to become tilted, and the tilted support plate causes the plurality of support pins to be at different horizontal levels.

In a specific embodiment, a bottom portion of the slide block has a pair of pivotal arms, and the connection arm of the lifting pole is located between the pair of pivotal arms and forms a pivotal connection between the connection arm and the pair of pivotal arms via a shaft.

In a specific embodiment, the second spring is located between the shaft and the inner wall and is secured by a fixing seat on the inner wall.

It is another object of the present invention to provide a cavity having a carrier plate for carrying a wafer. The support plate is below the carrier plate, the plurality of support pins are configured to ascend and descend relative to the carrier plate, the support plate at the high position forces the plurality of contacted support pins to be raised at same horizontal level above the carrier plate, and the support plate at the low position forces the plurality of contacted support pins to be raised at different horizontal levels above the carrier plate, so that the wafer supported by the plurality of support pins away from above the carrier plate is horizontal, and the wafer close to the carrier plate is tilted until the wafer is completely placed on the carrier plate.

BRIEF DESCRIPTION OF THE DRAWINGS

Reference can be made to the drawings and description below to better understand the present invention. Non-limiting and non-exhaustive embodiments are described with reference to the drawings below. It is to be noted that the components in the drawings are not necessarily drawn to their actual sizes, and are depicted to focus on the description on structures and principles.

In FIG. 1 to FIG. 7B, the correspondence between numerals and components is: 10: wafer support pin lifting device; 101: support plate; 1011: first support portion; 1012: second support portion; 1013: third support portion; 1014: top portion; 1015: bottom portion; 1016: sleeve; 102: slide block; 1020: body; 1021: outer side; 1022: inner side; 1023: slide channel; 1024: limiting portion; 1025: pivotal arm; 1026: notch; 1027: pathway; 1028: hole; 103: lifting pole; 1031: first end; 1032: second end; 1033: third end; 1034: connection arm; 1035: protrusion; 1036: protrusion; 1038: outer side; 1039: inner side; 104: actuator; 1041: pole; 12: carrier plate; 121: support pin; 20: cavity; 201: wafer transfer port; 202: inner wall; 2021: slide track; 2022: fixing seat; 203: bottom portion; 2031: pathway; 600: shaft; 601: bottom surface; 602: inner side surface; 603: first limiting surface; 604: second limiting surface; 605: first spring; 606: second spring; 700: wafer; G1: first gap; G2: second gap; G3: third gap; G4: fourth gap.

DETAILED DESCRIPTION OF THE EMBODIMENTS

To better describe the present invention, examples and specific embodiments are given with the accompanying drawings below. However, the subject matter of the application may be specifically implemented in various different forms, and the construction covered or asserted by the subject matter of the application is not limited to any exemplary specific embodiments disclosed in the detailed description of the application; it should be understood that the specific embodiments are non-limiting and are not to be construed as restrictive. Similarly, the present invention is to provide a reasonably broad scope for the subject matter applied or covered by the subject matter. In addition, the asserted subject matter may be implemented in form of a method, device or system. Thus, the specific embodiments may be embodied by any combination (non-software known) of such as hardware, software and firmware.

The expression "in one embodiment" used in the literature of the application does not necessarily refer to the same specific embodiment, and the expression "in other (some/certain) embodiments" used in the literature of the application does not necessarily refer to different specific embodiments. The object of the above is, for example, to include combination of all or part of the exemplary specific embodiments by the subject matter set forth.

Figure 1:
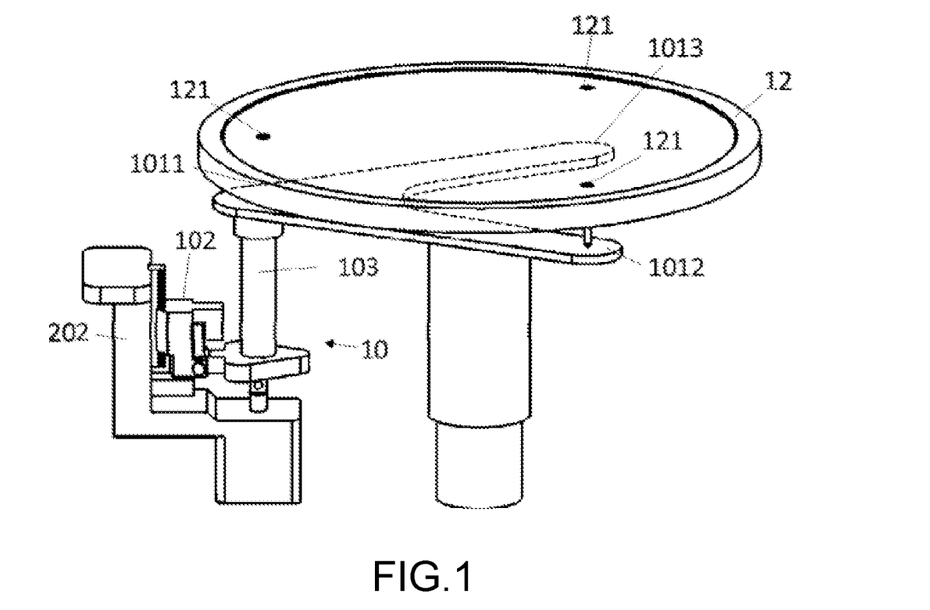
FIG. 1 is a perspective view of a relation between a wafer support pin lifting device and a carrier plate of the present invention.
Figure 2:
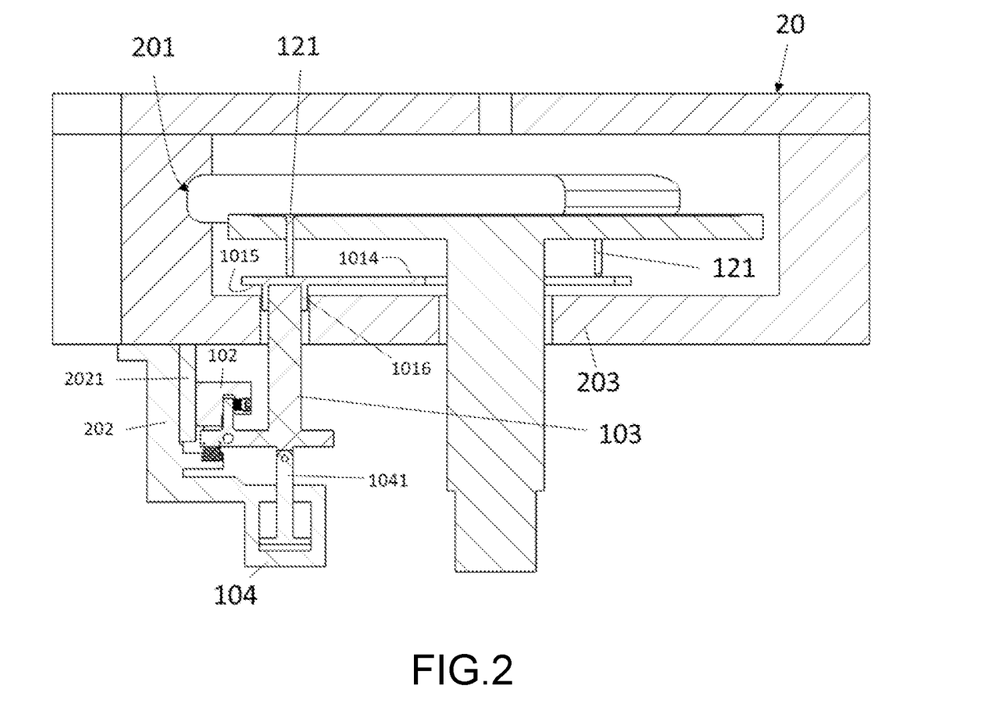
FIG. 2 is a cross-sectional diagram of a relation between a wafer support pin lifting device and a cavity of the present invention.

FIG. 1 shows a perspective view of a relation between a wafer support pin lifting device (10) and a carrier plate (12) of the present invention. FIG. 2 shows a relation among the wafer support pin lifting device (10), the carrier plate (12) and a cavity (20) of the present invention. In a known configuration, the cavity (20) may include a showerhead plate (not shown), a wafer transfer port (201) and an exhaust channel (not shown). The carrier plate (12) is primarily for placing a wafer, and may be configured as a heating plate or further provided with an electrode plate. The cavity (20) has an inner wall (202) lower than the carrier plate (12), wherein the inner wall (202) can partially shield mechanisms of the wafer support pin lifting device (10) of the present invention. Although only part of the inner wall (202) is depicted in the drawings, the inner wall (202) in practice may encircle into enclosed space so as to form a lower part of the cavity (20). Alternatively, in a possible configuration, the inner wall (202) may be a bracket, such that the wafer support pin lifting device (10) of the present invention is partially exposed below the cavity (20). It should be understood that, these configurations may all be possibly encompassed within the scope of the present invention.

The carrier plate (12) is provided with a plurality of support pins (121), which can ascend and descend relative to the carrier plate (120). For example, these support pins (121) may be raised to a high position, so that mechanical fingers entering the cavity from the wafer transfer port (201) can place the wafer on these support pins (121) at the high position. Then, these support pins (121) are lowered to a low position (for example, a position lower than a surface of the plate) so as to transfer the wafer onto the carrier plate (12) to complete placement of the wafer. As given in the description of the related prior art, conventional support pins are kept at the same height during a motion process from a high position to a low position (or from a low position to a high position), such that an airflow is easily caused at a bottom portion of the wafer and a surface of the carrier plate to shift the wafer. Thus, the effect to be achieved by the present invention is to both lower and to raise a wafer on a carrier plate in a tilted manner.

The wafer support pin lifting device (10) includes a support plate (101), which is configured below the carrier plate (12) and is capable of ascending and descending movements. According to FIG. 2, the support plate (101) penetrates through a bottom portion (203) of the cavity (20) and cooperates with a channel structure of the bottom portion (203). According to FIG. 1, the support plate (101) is a plate having a special shape, and has a first support portion (1011), a second support portion (1012) and a third support portion (1013). The second support portion (1012) and the third support portion (1013) symmetrically extend from the first support portion (1011) and form a V shape, thereby avoiding a column at the bottom portion of the carrier plate (12). It is to be noted that the shape of the support plate (101) of the present invention is not limited to the example above. As shown, the first support portion (1011), the second support portion (1012) and the third support portion (1013) respectively support the corresponding support pins (121).

The support plate (101) has a top portion (1014) and a bottom portion (1015). The top portion (1014) is substantially a flat surface, and is for contacting bottom ends of the support pins (121). Thus, when the support plate (101) is in a horizontal state, that is, when the support plate (101) is parallel to the carrier plate (12), the support pins (121) are equivalent to being located on a same horizontal plane, and these support pins (121) protrude from the carrier plate (12) with a same height. When the support plate (101) is in a tilted state, that is, when the support plate (101) is not parallel to the carrier plate (12), the bottom ends of these support pins (121) may located at different heights, and these support pins (121) protrude from the carrier plate (12) with different heights. Accordingly, whether the support plate (101) is horizontal or tilted affects the relation between the wafer and the carrier plate (12). In particular, a means of the support plate (101) lowered to a low position and exhibiting a tilted state is one of the technical results to be achieved by the present invention.

The wafer support pin lifting device (10) of the present invention further includes a slide block (102), which is slidably connected to the inner wall (202). In particular, an inner side of the inner wall (202) is provided with a slide track (2021), so that the slide block (102) is connected to the inner wall (202) via the slide track (2021) and is thus operable to ascend or descend. Specifically, the slide block (102) moves between a high position and a low position on the slide track (2021). The slide block (102) primarily guides the ascending and descending movements of the wafer support pin lifting device (10) of the present invention, and limits a level of tilting of the support plate (101). Other details of the slide block (102) will be described later.

It is to be understood that, the terms "high position" and "low position" used in the disclosure do not simply refer to a highest position and a lowest position defined by the mechanical structure itself. The terms "high position" and "low position" in the disclosure are to be interpreted as a relative relation of ascending and descending movements in a predetermined range; that is, the term "high position" in the disclosure should include a highest position or the vicinity of the highest position of the ascending and descending movements, and the term "low position" should include a lowest position or the vicinity of the lowest position of the ascending and descending movements. For example, "high position" and "low position" of the slide track (2021) are not necessarily at ends of the track.

The slide block (102) is coupled to the support plate (101) by a lifting pole (103). Specifically, the slide block (102) is pivotally connected to the lifting pole (103), and the two are configured such that the lifting pole (103) pivotally rotates relative to the slide block (102) during the ascending and descending movements. The lifting pole (103) passes through and fixedly connected to the bottom of the support plate (101), so that the lifting pole (103) tilts the support plate (101) according to the pivoting during the ascending and descending movements.

An actuator (104) is provided at a bottom end of the inner wall (202) and below the lifting pole (103), and is connected to the lifting pole (103) by a post (1041). Specifically, the actuator (104) is a cylinder actuator, is connected to the lifting pole (103) by the post (1041) and is for used for controlling ascending and descending movements of the lifting pole (103). The lifting pole (103) also drives the slide block (102) for synchronous ascending and descending movements. Other details of the lifting pole (103) will be described later.

Figure 3:
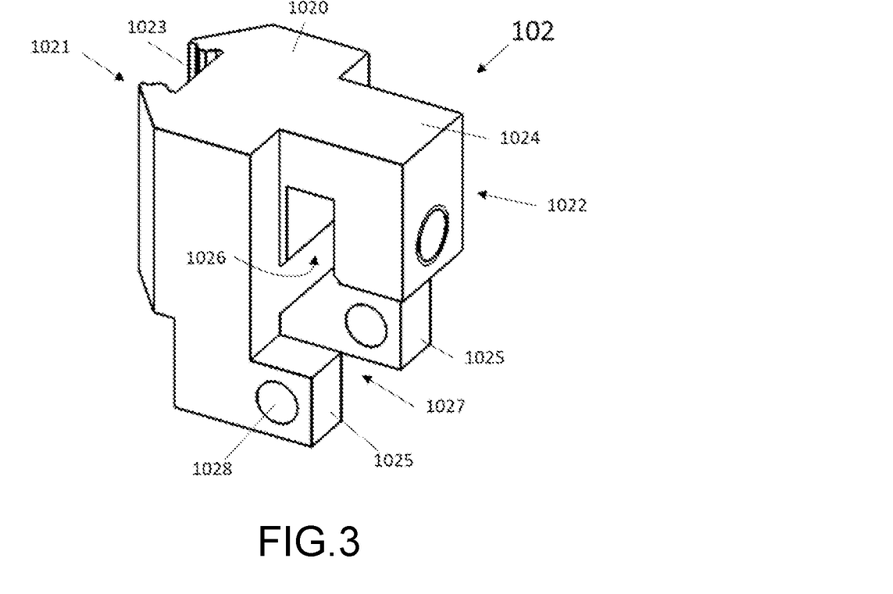
FIG. 3 is a perspective view of a slide block of a wafer support pin lifting device of the present invention.

FIG. 3 shows diagram perspective view of details of the slide block (102). The slide block (102) has a body (1020), an outer side (1021) facing the inner wall (202) in FIG. 2, and an inner side (1022) facing the column at the bottom of the carrier plate (12). The outer side (1021) has a slide channel (1023) formed as longitudinally extending and for connecting to the slide track (2021) in FIG. 2, so that the slide block (102) can ascend and descend along the slide track (2021). The inner side (1022) has a structure matching the lifting pole (103), and includes a limiting portion (1024) and a pair of pivotal arms (1025). The limiting portion (1024) extends in a direction from the body (1020) towards the inner side (1022), the pivotal arms (1025) extends in a direction slightly downwards from the body to the inner side (1022), and the pair of pivotal arms (1025) are separated from each other. A bottom portion of the limiting portion (1024), that is, one side facing the pair of pivotal arms (1025) has a notch (1026) formed thereon, and the pair of pivotal arms (1025) and the bottom portion of the body (1020) define a pathway (1027). The limiting portion (1024) is further provided with a spring (not shown), which is partially exposed in the notch (1026). The pair of pivotal arms (1025) are provided with corresponding holes (1028) for accommodating a shaft (not shown).

Figure 4:
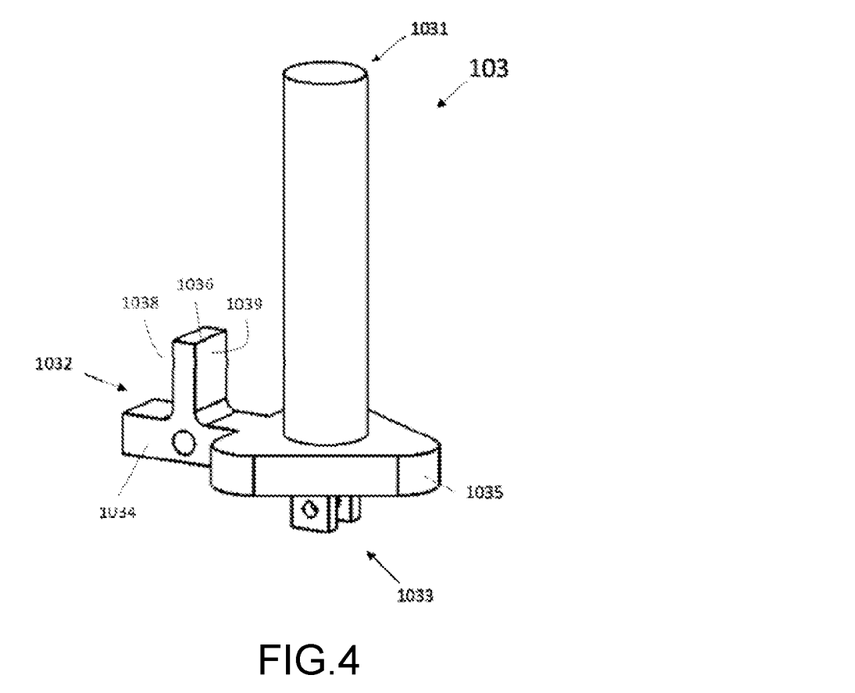
FIG. 4 is a perspective view of a lifting pole of a wafer support pin lifting device of the present invention.

FIG. 4 shows perspective view of details of the lifting pole (103). The lifting pole (103) is substantially a pole, and includes a first end (1031), a second end (1032) and a third end (1033). The first end (1031) is a top end of the pole, the third end (1033) is an opposite bottom end of the pole, the second end (1032) is located between the first end (1031) and the third end (1033) and is in particular close to the third end (1033), and the second end (1032) extends laterally from the pole. The first end (1031) has a structure matching a sleeve (1016) at the bottom portion (1015) of the support plate (101), and is, for example, cylindrical. The third end (1033) has a structure matching the post (1041) of the actuator (104), and is, for example, pivotal plates. The second end (1032) has a connection arm (1034), which laterally extends from the lifting pole (103) and is substantially shaped as a beam. A junction between the connection arm (1034) and the lifting pole (103) may be provided with a reinforcing board for reinforcing a root of the connection arm (1034) to prevent breakage. The connection arm (1034) has a top portion and a bottom portion. The top portion of the connection arm (1034) is provided with a protrusion (1036) protruding upwards and located above a hole of the connection arm (1034). The protrusion (1035) has an outer side (1038) and an inner side (1039), and is for matching the notch (1026) of the limiting portion (1024), with associated details will be described later.

Figure 5:
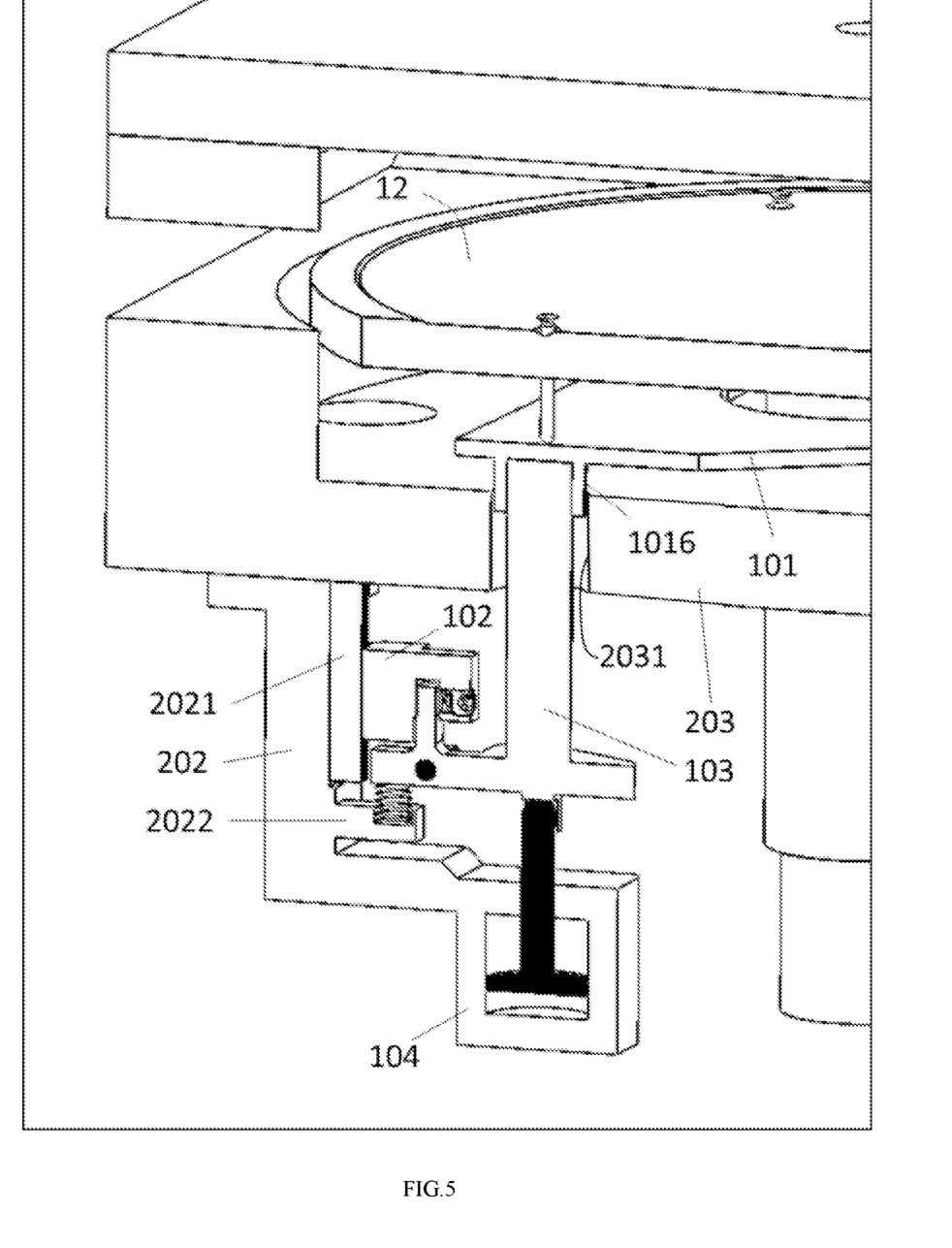
FIG. 5 is a perspective view of a relation between a wafer support pin lifting device and a cavity of the present invention.

FIG. 5 shows a result of connection of the slide block (102) and the lifting pole (103), and in particular shows the match of the notch (1026) and the protrusion (1035). The first end (1031) of the lifting pole (103) extends to above the bottom (203) of the cavity and is connected to the sleeve (1016) of the support plate (101). The bottom portion (203) of the cavity has a pathway (2031) allowing the lifting pole (103) and the sleeve (1016) of the bottom of the support plate (101) to pass through. A diameter of the pathway (2031) is slightly larger than that of the sleeve (1016), and thus allows the support plate (101) to be linked by the lifting pole (103) and to become slightly tilted.

Figure 6:
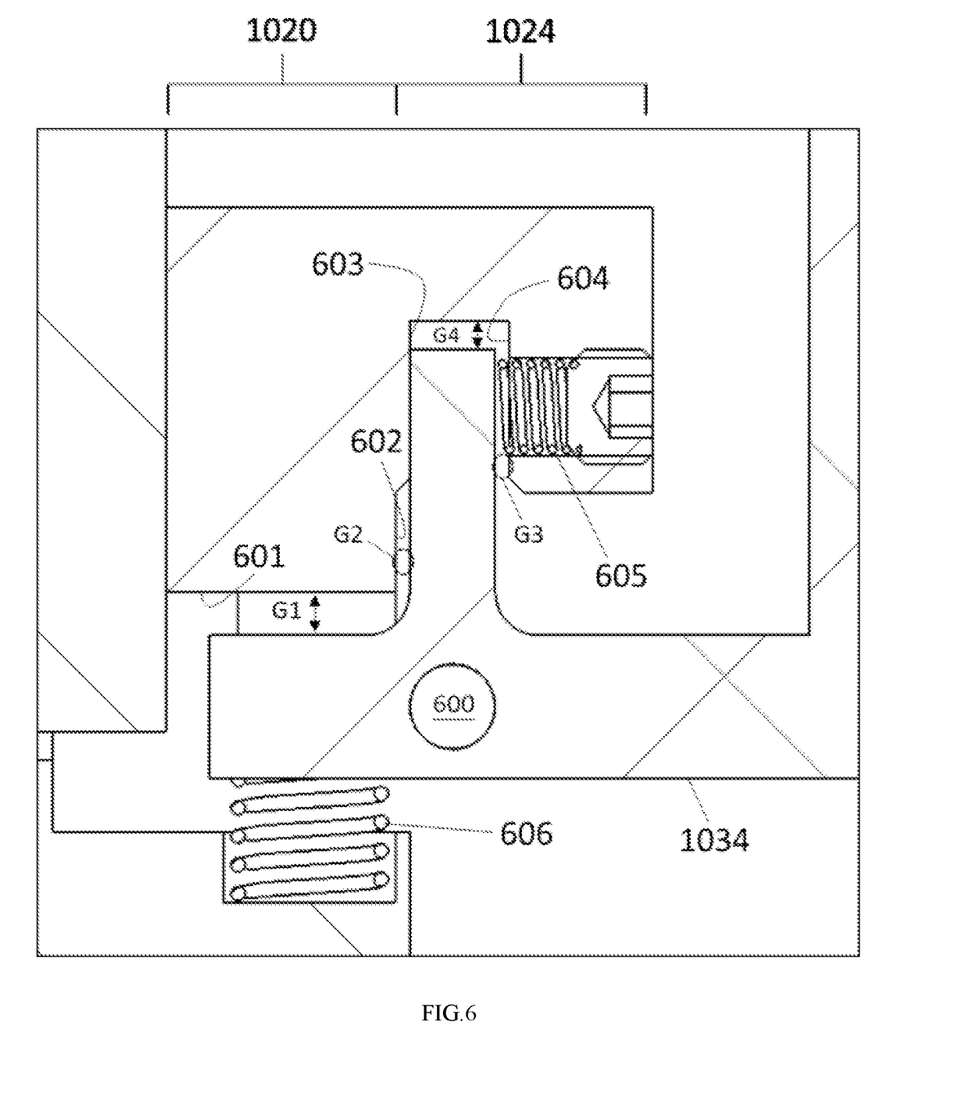
FIG. 6 is an enlarged partial perspective view of a pivotal mechanism of a wafer support pin lifting device of the present invention.

FIG. 6 shows an enlarged partial sectional view of FIG. 5, and depicts connection details of the slide block (102) and the lifting pole (103) in a low position state. Referring to FIG. 3 and FIG. 4, the connection arm (1034) of the lifting pole (103) extends to the pathway (1027) between the pair of pivotal arms (1025), and the two are connected by a shaft (600). As shown in FIG. 6, between a bottom surface (601) of the body (1020) of the slide block (102) and the top portion of the connection arm (1034) a first gap (G1) is formed, and between the outer surface (1038) of the protrusion (1036) and an inner side surface (602) of the body (1020) a second gap (G2) is formed. The notch (1026) of the limiting portion (1024) is defined by a first limiting surface (603) and a second limiting surface (604) opposite to each other. The first limiting surface (603) and the second limiting surface (604) are substantially flat surfaces extending longitudinally, and when the protrusion (1036) touches against the first limiting surface (603) (as shown in the drawing), a third gap (G3) is formed between the inner side (1039) of the protrusion (1036) and the second limiting surface (604). Further, between the top portion of the protrusion (1036) and the top portion of the notch (1026) a fourth gap (G4) is formed. These gapes (G1, G2, G3 and G4) provide the connection arm (1034) and the protrusion (1036) with a pivotal space.

The limiting portion (1024) has a first spring (605), which is configured at the second limiting surface (604) and is compressible in a horizontal direction. The first spring (605) is for contacting the inner side (1039) of the protrusion (1036) and applying a lateral biasing force on the protrusion (1036). Preferably, the lateral biasing force is continuously applied on the protrusion (1036), forcing the outer side (1038) of the protrusion (1036) to touch against the first limiting surface (602) so as to ensure that the lifting pole (103) is kept in an erected state. The third gap (G3) can determine the compression level of the first spring (605). For example, when the lifting pole (103) starts pivotally rotating from the erected state, the inner side (1039) of the protrusion (1036) first compresses the first spring (605), preventing the protrusion (1036) from direct colliding with the second limiting surface (604). The degree of the pivoting may be determined by the second limiting surface (604). However, in other possible implementations, the range of the pivoting may be determined by the gaps (G1, G2, G3 and G4).

Referring to FIG. 5, on the inner wall (202), a fixing seat (2022) is further provided below the slide track (2021) and is configured to secure a second spring (606). As shown in FIG. 6, the second spring (606) is located below the connection arm (1034) and between the shaft (600) and the inner wall (202), and is configured to be compressed and deformed in a longitudinal direction. The second spring (606) is in the vicinity of the bottom end of the slide track (2021), and thus the second spring (606) may contact the bottom portion of the connection arm (1034) when the lifting pole (103) is at the low position. That is, the second spring (606) may apply an upward biasing force on the lifting pole (103), and in particular, on the bottom end of the connection arm (1034). The upward biasing force causes the lifting pole (103) to deflect based on the shaft (600). It is known according to physical properties of a spring that, the compression level of the second spring (606) is directly proportional to the deflection extent. Preferably, the upward biasing force preliminarily produced by the second spring (606) is expected to be larger than the initial lateral biasing force produced by the first spring (605) so as to allow the deflection to successfully take place. In other words, the pivoting of the lifting pole (103) is primarily incurred by the upward biasing force applied by the second spring (606). According to the disclosure of this embodiment, the bottom portion of the connection arm (1034) acts as a position of an applied force for the deflection, and the inner side (1039) of the protrusion acts as a position of an applied force for resisting the deflection; however, in other possible implementations, there may be other positions of the applied forces, for example, in a situation where the position of the shaft (600) is changed. In other possible embodiments, the spring may be replaced by a magnet, and the biasing force may be a magnetic attraction or a magnetic repulsion.

Figure 7A:
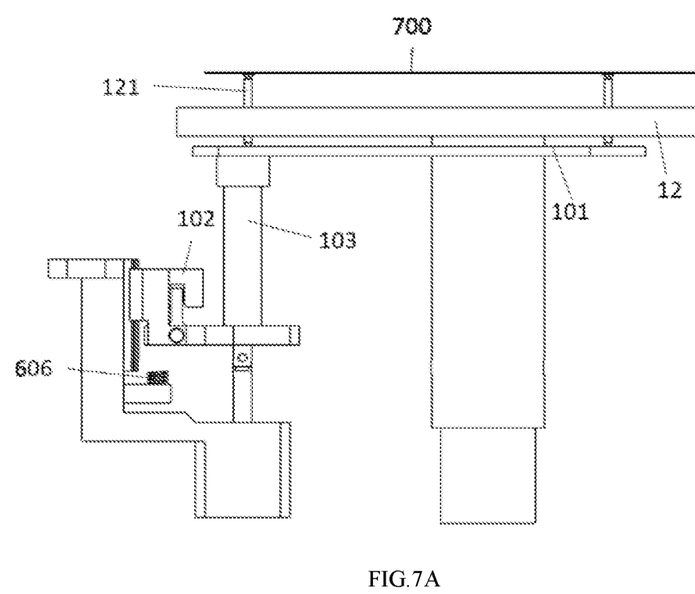
FIG. 7A depicts a relation of a wafer, support pins and a carrier plate when a wafer support pin lifting device of the present invention is at a high position state.
Figure 7B:
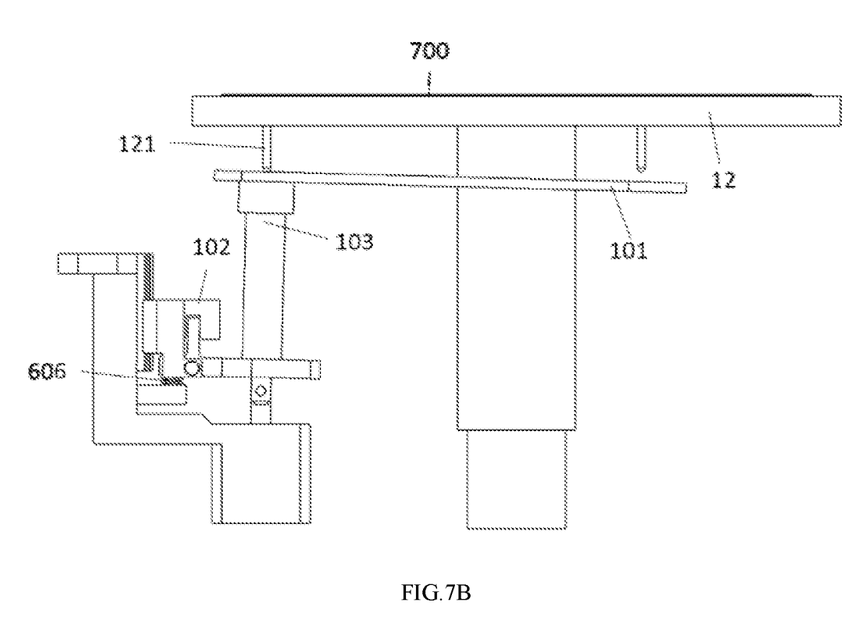
FIG. 7B depicts a relation of a wafer, support pins and a carrier plate when a wafer support pin lifting device of the present invention is at a lower position state.

FIG. 7A and FIG. 7B respectively depict a relation of a wafer, support pins and a carrier plate when a wafer support pin lifting device of the present invention is in a high position state and a lower position state. Referring to FIG. 7A, when the wafer support pin lifting device of the present invention is in the high position state, it means that the lifting pole (103) is raised to a relatively high position, such that the connection arm (1034) is away from the second spring (606). Thus, the connection arm (1034) receives only the lateral biasing force from the first spring (605) and the lifting pole (103) is forcibly kept in an erected state, while the support plate (101) is horizontal. The erected state means that the pole of the lifting pole (103) is visually parallel to the column at the bottom of the carrier plate (12). The raised and horizontal support plate (101) raises these support pins (121) at same horizontal level above the carrier plate (12), such that the carried wafer (700) also appears horizontal.

During the process of the lifting pole (103) being lowered from the high position to the low position and before contacting the second spring (606), the lifting pole (103) is kept in the erected state. Thus, the wafer (700) is kept horizontal during the descending process, until the wafer (700) is about to touch the surface of the carrier plate (12). Once the connection arm (1034) starts contacting the second spring (606), the upward biasing force forces the lifting pole (103) to start the deflection. Specifically, the top portion (that is, the first end 1031) of the lifting pole (103) starts to tilt toward the column at the bottom of the carrier plate (12), and the tilting becomes more noticeable as the descending of the lifting pole (103) increases. The support plate (101) also tilts in synchronization. Referring to FIG. 1, the horizontal level of the first support portion (1011) corresponding to a position of the lifting pole (103) is higher than the horizontal level of the second support portion (1012) and the third support portion (1013). Due to symmetry, the second support portion (1012) and the third support portion (1013) are substantially at the same horizontal level. At this point, the support pin (121) corresponding to the first support portion (1011) protrudes more from the carrier plate (12) compared to the support pins (121) corresponding to the second support portion (1012) and the third support portion (1013), and so the carried wafer likewise appears tilted. It should be noted that the extent of tilting is insufficient for the wafer to slip off the support pins (121).

Movement of the mechanism should be designed such that before the wafer is about to but not yet contacting the carrier plate (12), the lifting pole (103) necessarily touches the second spring (606) to start the deflection. During the descending process to the low position, a lower end of the tilted wafer (700) first touches the carrier plate (12), and the other higher end in opposite then subsequently touches the carrier plate (12). The placement approach above helps gradual discharge of air from between the wafer (700) and the carrier plate (12), preventing drastic air flow disturbances. In other words, the two support pins (121) away from the lifting pole (103) first lower to the low position, and the support pin (121) close to the lifting pole (103) then last lowers to the low position. As shown in FIG. 7B, the lifting pole (103) may lower to the low position such that these support pins (121) are no longer supported by the support plate (101). It should be noted that, the extent of tilting of the support plate (101) should be restricted to prevent the support pins (121) close to the lifting pole (103) from being lifted by the part that is too high.

Similarly, the same strategy is used for raising the wafer (700) from the carrier plate (12). The raised lifting pole (103) first lifts the support pins (121) at the distal and proximal ends, so that one end of the wafer (700) is first lifted and the other opposite end is then lifted. The lifting approach above helps gradually drawing air into between the wafer (700) and the carrier plate (12), preventing drastic air flow disturbances. Once the upward biasing force from the second spring (606) has decreased to a point where it no longer acts on the lifting pole (103), the wafer (700) is deflected to the horizontal state as shown in FIG. 7A and awaits for fetching by the mechanical fingers.

The support pins of the present invention are described in detail by way of the preferred embodiments and the accompanying above. All the features disclosed in the present application may be combined with other means, and each of the features disclosed in the present application may also be selectively replaced by the same, equivalent to similar objective features. Therefore, apart from the more obvious features, the features disclosed in the present application are merely one example of equivalent or similar features. With the preferred embodiments of the present invention, a person skilled in the art could understand that the present invention is a novel, inventive and industrially applicable invention and possesses development values. Various modifications may be made to the present invention by a person skilled in the art without departing from the scope of protection of the appended claims.

What is claimed is:

1. A wafer support pin lifting device, suitable for a cavity, the device comprising:
   a support plate, for supporting a plurality of support pins;
   a slide block, slidably connected to an inner wall of a cavity so that the slide block slides relative to the cavity; and
   a lifting pole, having a first end, a second end and a third end, wherein the first end is connected to the support plate, the second end is pivotally connected to the slide block, the third end is connected to an actuator, and the actuator is for controlling the lifting pole to ascend and descend between a high position and a low position;
   wherein, with a pivotal connection between the second end of the lifting pole and the slide block, the lifting pole approaching the high position causes the support plate to be approximately horizontal, and the lifting pole approaching the low position causes the support plate to be tilted.

2. The wafer support pin lifting device according to claim 1, wherein the support plate has a top portion and a bottom portion, the top portion is for carrying the plurality of support pins, and the bottom portion is connected to the first end of the lifting pole.

3. The wafer support pin lifting device according to claim 2, wherein the top portion of the support plate has a first support portion, a second support portion and a third support portion for carrying the plurality of support pins, the bottom portion of the support plate has a sleeve, the position of the sleeve is opposite to the position of the first support portion, and the sleeve is connected to the first end of the lifting pole.

4. The wafer support pin lifting device according to claim 1, wherein the inner wall of the cavity is provided with a slide track, and the slide block is connected to the inner wall via the slide track so that slide block ascends and descends relative to the inner wall.

5. The wafer support pin lifting device according to claim 4, wherein the first end of the lifting pole is opposite to the third end, the second end of the lifting pole is located between the first end and the third end, the second end has a connection arm laterally extending from the lifting pole, and the connection arm is pivotally connected to the slide block so that the lifting pole is pivotal relative to the slide block.

6. The wafer support pin lifting device according to claim 5, wherein the slide block has an inner side and an outer side, the outer side has a slide channel for connecting to the slide track, a first limiting surface and a second limiting surface are formed at the inner side, and the first limiting surface and the second limiting surface are opposite so as to form an accommodating space.

7. The wafer support pin lifting device according to claim 6, wherein the connection arm has a top portion and a bottom portion, the top portion of the connection arm has a protrusion, and the protrusion extends upwards from the top portion of the connection arm and is partially accommodated in the accommodating space formed by the first limiting surface and the second limiting surface.

8. The wafer support pin lifting device according to claim 7, wherein the second limiting surface is provided with a first spring, and the first spring applies a lateral biasing force towards an inner side of the protrusion.

9. The wafer support pin lifting device according to claim 8, wherein the inner wall is provided with a second spring, and the second sprig is located below the connection arm and configured to apply an upward biasing force on the bottom portion of the connection arm when the lifting pole approaches the low position, so that the lifting pole pivots relative to the slide block, causing the support plate to become tilted.

10. The wafer support pin lifting device according to claim 9, wherein the connection arm at the high position receives only the lateral biasing force applied on the protrusion from the first spring, so that the protrusion contacts the first limiting surface to force the support plate to become horizontal, and the horizontal support plate causes the plurality of support pins to be at same horizontal level.

11. The wafer support pin lifting device according to claim 10, wherein the connection arm at the low position receives the lateral biasing force applied on the protrusion from the first spring and the upward biasing force applied on the bottom portion of the connection arm from the second spring, so that the support plate is forced to become tilted, and the tilted support plate causes the plurality of support pins to be at different horizontal levels.

12. The wafer support pin lifting device according to claim 11, wherein a bottom portion of the slide block has a pair of pivotal arms, and the connection arm of the lifting pole is located between the pair of pivotal arms and forms a pivotal connection between the connection arm and the pair of pivotal arms via a shaft.

13. The wafer support pin lifting device according to claim 12, wherein the second spring is located between the shaft and the inner wall and is secured by a fixing seat on the inner wall.

14. The wafer support pin lifting device according to claim 1, further comprising a carrier plate for carrying a wafer, wherein the support plate is below the carrier plate, the plurality of support pins are configured to ascend and descend relative to the carrier plate, the support plate at the high position forces the plurality of contacted support pins to be raised at same horizontal level above the carrier plate, and the support plate at the low position forces the plurality of contacted support pins to be raised at different horizontal levels above the carrier plate, so that when the support plate is at the high position, the wafer supported by the plurality of support pins is horizontal and the when the support plate is at the low position, the wafer supported by the plurality of support pins is tilted until the wafer is completely placed on the carrier plate.

* * * * *